United States Patent
Blatz et al.

(10) Patent No.: US 6,922,553 B2
(45) Date of Patent: Jul. 26, 2005

(54) METHOD AND CIRCUIT FOR OBTAINING FIELD STRENGTH INFORMATION

(75) Inventors: Werner Blatz, Leingarten (DE); Helmut Moser, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 430 days.

(21) Appl. No.: 10/308,249

(22) Filed: Dec. 2, 2002

(65) Prior Publication Data

US 2003/0104795 A1 Jun. 5, 2003

(30) Foreign Application Priority Data

Dec. 5, 2001 (DE) ......................................... 101 59 551

(51) Int. Cl.⁷ .............................................. H04B 17/00
(52) U.S. Cl. .................................................. 455/226.2
(58) Field of Search .......................... 455/226.1, 226.2, 455/226.3, 226.4, 67.7

(56) References Cited

U.S. PATENT DOCUMENTS

| | | | | |
|---|---|---|---|---|
| 5,239,701 A | * | 8/1993 | Ishii | 455/180.1 |
| 5,581,213 A | * | 12/1996 | Linder et al. | 330/282 |
| 5,773,974 A | | 6/1998 | Kraz | |
| 5,999,803 A | * | 12/1999 | Kim | 455/226.2 |
| 6,219,543 B1 | | 4/2001 | Myers et al. | |

FOREIGN PATENT DOCUMENTS

| | | |
|---|---|---|
| DE | 19753186 | 6/1999 |
| DE | 19852525 | 5/2000 |
| EP | 0600143 | 6/1994 |

OTHER PUBLICATIONS

"Wireless Design Guide/Data Book 2001", pp. 231 to 237, published by ATMEL Germany GmbH of Heilbronn, Germany.

* cited by examiner

Primary Examiner—Nguyen T. Vo
(74) Attorney, Agent, or Firm—W. F. Fasse; W. G. Fasse

(57) ABSTRACT

A receiving unit including an operational amplifier having a fixed gain receives an electromagnetic signal, from which a voltage divider with a variable resistance generates an input voltage for the amplifier. The amplifier's output voltage is compared with a reference voltage. The variable input resistance is adjusted to vary the amplifier's input voltage, until the amplifier's output voltage lies within a defined range around the reference voltage. This adjusted resistance value is compared with nominal resistance values previously stored in a value field and respectively allocated to field strength values, to determine a field strength of the received signal. A circuit arrangement includes an operational amplifier, a memory unit connected to a processor unit, a first voltage divider, a second voltage divider, and a control element that controls the second voltage divider to provide the controlled variable input resistance. The processor unit reads the control state of the control element to determine the adjusted input resistance, and therefrom determines the field strength value of the received signal.

25 Claims, 2 Drawing Sheets

METHOD AND CIRCUIT FOR OBTAINING FIELD STRENGTH INFORMATION

PRIORITY CLAIM

This application is based on and claims the priority under 35 U.S.C. §119 of German Patent Application 101 59 551.4, filed on Dec. 5, 2001, the entire disclosure of which is incorporated herein by reference.

FIELD OF THE INVENTION

The present invention relates to a method and a circuit arrangement for obtaining field strength information regarding the field strength of a received electromagnetic signal.

BACKGROUND INFORMATION

A method of the above mentioned general type is known from the publication ATMEL "Wireless Design Guide/Data Book 2001", page 233, published by ATMEL Germany GmbH of Heilbronn, Germany. In this reference, an output voltage, which is proportional to the input signal of a receiving antenna, is generated by means of a so-called "RSSI (Received Signal Strength Indicator) amplifier".

The output voltage thus represents a measure for the received field strength of the input signal. In general, this is achieved by cascading individual amplifier stages, of which ever more stages are driven into saturation as the input signal level rises. A signal proportional to the field strength of the received signal can be derived from the cumulative value of the output currents of the amplifier stages. The disadvantage of using RSSI amplifiers is the high current consumption of the method. Moreover, such amplifiers have long turn on and turn off transient times to achieve stable conditions, especially with quickly changing input signal levels which, particularly in the case of pulse-pause modulated signals, make it necessary to adapt the length of the field gap to the maximum attainable amplitude height in the input signal in order to ensure reliable data transmission. This substantially reduces the data transmission or transfer rate.

Among other uses, methods for gaining field strength information are used in systems for contactless data transmission. An important field of application is for identification systems which are, for example, used in an automotive vehicle for controlling access to the vehicle. Such identification systems consist of a base unit and one or more transponders. In this case, the distance between the transmitter and the receiver can be determined by means of the field strength information. Thus, this information makes it possible to increase the security against an unauthorized passing-on or relaying of the data transmission.

SUMMARY OF THE INVENTION

In view of the above, it is an object of the present invention to provide a method by which the field strength of an input signal can be determined in a simple manner, with low power consumption, and while avoiding long transient time effects. A further object of the present invention is to provide a circuit arrangement for performing the method. The invention further aims to avoid or overcome the disadvantages of the prior art, and to achieve additional advantages, as apparent from the specification. The attainment of these objects is, however, not a required limitation of the invention.

The above objects have been achieved according to the invention in a method for obtaining or determining a field strength information of an electromagnetic signal received by a receiver unit or device, which includes an operational amplifier having a fixed amplification factor. The method involves generating or providing an input voltage for the operational amplifier by means of an input resistance, and determining a ratio of the input voltage relative to the output voltage of the operational amplifier. Particularly according to the invention, the method involves comparing the output voltage of the operational amplifier with a reference voltage, and then varying the input resistance so as to vary or change the input voltage of the operational amplifier, until the output voltage of the operational amplifier lies within a prescribed interval or range (e.g. a tolerance range such as ±5%) around and encompassing the value of the reference voltage.

Finally, the method involves comparing the value of the thusly adjusted input resistance with nominal resistance values that have been previously stored in a value field together with respectively allocated nominal field strength values, so as to thereby allocate a particular field strength value to the particular received signal. For example, this involves selecting the stored nominal resistance value or state (and its associated nominal field strength value) that matches the adjusted resistance value or state.

Namely, the nominal resistance values stored in the value field provide a previously determined correspondence or linkage between respective allocated field strength values and values of the input resistance that will, for an input signal with a given field strength, cause the output voltage to fall within the prescribed interval or range around the reference voltage. Since the amplifier gain and the reference voltage are fixed, the amplifier input voltage must effectively be held constant to keep the output voltage in the specified range or interval around the reference voltage. Thus, if the received signal has a lower signal strength, then the variable voltage divider at the input must be adjusted to a higher proportional voltage level at the divider or reducer node of the voltage divider, while if the received signal has a higher signal strength, then the variable voltage divider at the input must be adjusted to a lower proportional voltage level at the divider or reducer node, to maintain the constant amplifier input voltage. The adjusted resistance value of the voltage divider as required for driving the amplifier output voltage to the reference voltage (or into the specified reference range) is thus directly related to, and indicative of, the field strength of the received signal. The nominal resistance values and allocated field strength values to be stored in the value field, e.g. as a lookup table, can be previously determined by tests and empirical measurements, or by circuit calculations.

The above objects have further been achieved according to the invention in a circuit arrangement that is suitable for carrying out the inventive method. The circuit arrangement comprises: a signal input; a signal output; an operational amplifier having first and second amplifier inputs and an amplifier output that is connected with the signal output; a processor unit; a memory unit connected with the processor unit; a first voltage divider having a reducer or divider node connected with the first amplifier input, a first terminal connected with the amplifier output, and a second terminal connected with a reference potential such as ground; a second voltage divider having a reducer or divider node connected with the second amplifier input, and comprising a series connection of a first resistance or resistor connected with the signal input and a second controllable variable resistance connected with the reference potential, and with the divider node arranged between the first and second resistances; and a control element having a reference input connected with a reference voltage, a terminal connected with the amplifier output, a control output connected with a control input of the second controllable resistance of the second voltage divider, a data output connected with the processor unit, and a clock input connected with the processor unit.

The essence of the invention is that the field strength of an electromagnetic signal is determined from the magnitude of an input resistance. For this purpose, upon receiving an electromagnetic signal in a receiver unit, an input voltage for an operational amplifier having a fixed amplification factor is generated from the received signal by means of an input resistor, and the ratio of the input voltage to the output voltage is determined by comparing the output voltage of the operational amplifier to a reference voltage. Moreover, the input voltage of the operational amplifier is modified by changing the input resistance until the output voltage lies within a defined interval approximating or encompassing the level of the reference voltage. The received signal is subsequently assigned a field strength value by comparing the final established value of the changed input resistance with values which are stored in a value field.

An advantage of the method is that the field strength of the received electromagnetic signal can be determined in a simple manner from the magnitude of the resistance value. In this case, the input resistance is correspondingly increased or reduced if the output voltage of the operational amplifier lies below or above the voltage range defined by the interval. As the amplification of the operational amplifier remains constant, the output voltage of the operational amplifier has a fixed ratio relative to the input voltage. For this purpose, the amplification is not increased for either small or large input voltages, and the ratio of signal voltage to noise voltage remains low throughout the entire amplification range. Moreover, a fast turn on and turn off transient behavior to establish stable conditions is attained at the output of the operational amplifier, particularly in the case of varying signal levels, because the output voltage and the input voltage of the operational amplifier do not fluctuate significantly, the voltage or charging states of capacitances present at the input and output of the operational amplifier are not reciprocally changed or reversed, and the power consumption is reduced. Particularly in the case of pulse-pause modulated signals, the quick turn on and turn off transient behavior to achieve stable conditions enables the field gap to be reduced and the data transmission rate to be increased. Another advantage of the fixed amplification factor is that, in the case of the operational amplifier, the amplification can be precisely set with a low current consumption by means of a high impedance negative feedback.

In a further development of the inventive method, the input resistance is changed in discrete steps. It is simply necessary to provide a sufficient number of available resistance steps to achieve the desired stepped precision or "fineness" of the determination of the field strength. In this embodiment using discrete resistance steps, the circuit complexity for changing the input resistance is substantially reduced in comparison to a sliding continuous or infinitely variable change of the input resistance.

Moreover, it is advantageous to feed the input voltage to the operational amplifier from a reducer or divider node of an input resistor realized as a voltage divider, and in this case to change the resistance value of the part of the voltage divider connected to a reference potential. The input voltage of the operational amplifier can be kept constant to the greatest possible extent as a result of the passive construction by means of resistors, without changing the low current consumption of the input circuit.

In addition, the method can be used to determine the distance between the receiving unit and a transmission unit by linking respective distance values to the field strength values assigned to the relevant resistance values in the value table. In this case, the values from the value table enable a permissible distance range for an authorized data transmission to be specified, and the transmission can be blocked or terminated if the transmission distance exceeds the permissible distance range. On the other hand, the data transmission rate can be increased as the field gap or transmission distance becomes smaller. Also, because of the low power consumption, the method is especially suitable for obtaining field strength information in the case of transponders.

BRIEF DESCRIPTION OF THE DRAWINGS

In order that the invention may be clearly understood, it will now be described in connection with example embodiments, with reference to the accompanying drawings, wherein.

DETAILED DESCRIPTION OF PREFERRED EXAMPLE EMBODIMENTS AND OF THE BEST MODE OF THE INVENTION

Figure 1:
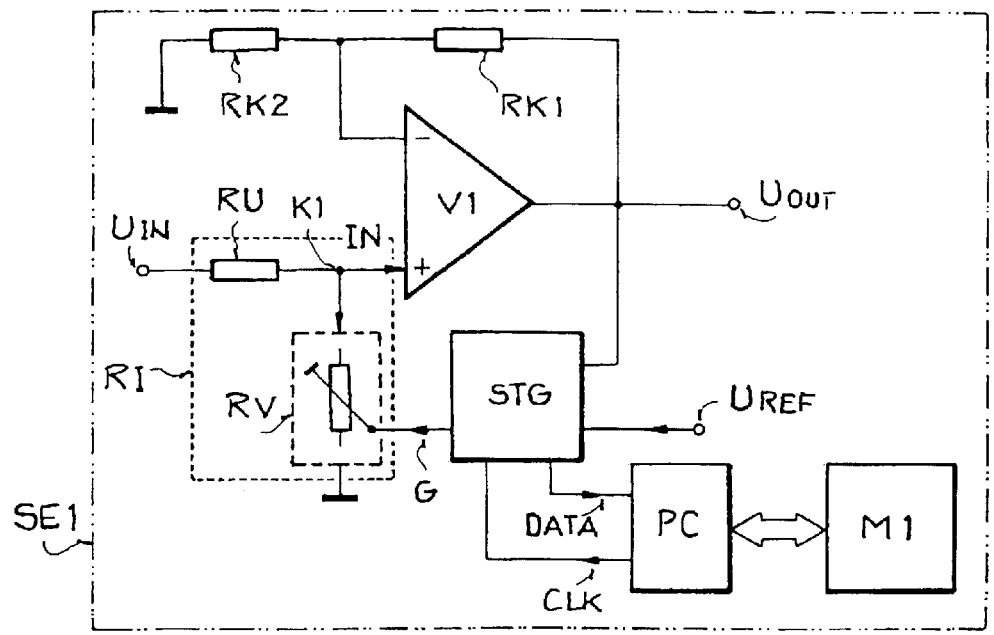
FIG. 1 is a block circuit diagram of an amplifier circuit with a voltage divider at the input with which the resistance value of the voltage divider is changed by means of a control element.

The task or purpose of the circuit arrangement shown in FIG. 1 is to amplify an alternating voltage form input signal UIN, which is proportional to the signal level or field strength of an electromagnetic signal received by a receiving antenna (not shown), by a fixed factor by means of an operational amplifier V1, and while doing so to hold or maintain the amplifier output signal UOUT within a defined interval by means of a control element STG, that changes the resistance value of an input resistance RI realized as a voltage divider RI, and to assign field strength information to the resistance value. The circuit arrangement is explained in greater detail in the following.

The voltage divider RI consists of a resistor RU and a controllable variable resistor or resistance RV linked to a reference potential, e.g. ground. In addition, the voltage divider has a divider node K1 which is linked to the non-inverting input of the operational amplifier V1. Furthermore, the amplifier output voltage UOUT is present at the output of the operational amplifier V1. The output of the operational amplifier V1 is linked to a resistor RK1 and to the control element STG. Furthermore, the resistor RK1 is linked to the inverting input of the operational amplifier and to a resistor RK2, which is linked to the reference potential. Moreover, the control element STG is linked to the control input of the variable resistor RV by means of a control line G and to a processor PC by means of a clock line CLK and a data line DATA. Furthermore, the control element STG has an input at which a reference voltage UREF is present. The processor PC is linked to a memory unit M1.

The principle of operation is explained in the following. The divided voltage IN resulting from the input signal UIN at the node K1 of the voltage divider RI is fed to the operational amplifier V1, whereby the voltage level at the node K1 is determined by the setting of the variable resistor RV. In this case, the amplification of the operational amplifier V1 is determined by the two resistors RK1 and RK2, by means of which the potential of the inverting input of the operational amplifier V1 is set. Investigations by the applicant have shown that it is particularly advantageous if high impedance values are used for both resistors RK1 and RK2, by means of which the amplification can be precisely set and at the same time the current consumption of the circuit arrangement can be reduced.

Furthermore, a voltage interval or tolerance range around and encompassing the reference voltage UREF is generated in the control element STG by means of the reference voltage UREF present at the reference input of the control element STG. If the amplifier output voltage UOUT is greater than, i.e. lies above, the voltage interval, then the resistance of the variable resistor RV is reduced by the control element STG by means of the control line G. If, on the other hand, amplifier output voltage UOUT is less than, i.e. lies below, the voltage interval, then the resistance value of the variable resistor RV is increased by the control element STG via the control line G. Furthermore, the resistance value set by the control element STG is communicated or provided to the processor PC by means of the data line DATA, in which the read-out of the data is synchronized by the processor PC by means of the clock pulse line CLK. Subsequently, the processor PC determines the level of the input voltage by comparing the set or adjusted value of the variable resistor RV with resistance values that have been previously stored in the memory unit M1, whereby these stored values are respectively allocated or assigned to respective items or values of field strength information.

An advantage of the inventive arrangement is that, as a result of the change in the input resistance in conjunction with the fixed amplification factor, the voltage levels at the input and at the output of the operational amplifier change very little, even in the case of strongly fluctuating input signals and/or field strengths. The voltages or charge states of the capacitances present at the output and the input of the operational amplifier are thus reciprocally changed or charged-over more quickly, and the circuit arrangement has shorter turn on and turn off transient times to establish stable conditions. The circuit arrangement has a low current consumption as a result of matching the circuit arrangement to the level or magnitude of the input signal by means of the voltage divider. Because of this, the battery discharges less quickly when this circuit is used in a transponder. Furthermore, the field gaps can be reduced, for example at a 125 kHz oscillation, and the data transfer rate can be increased.

Figure 2:
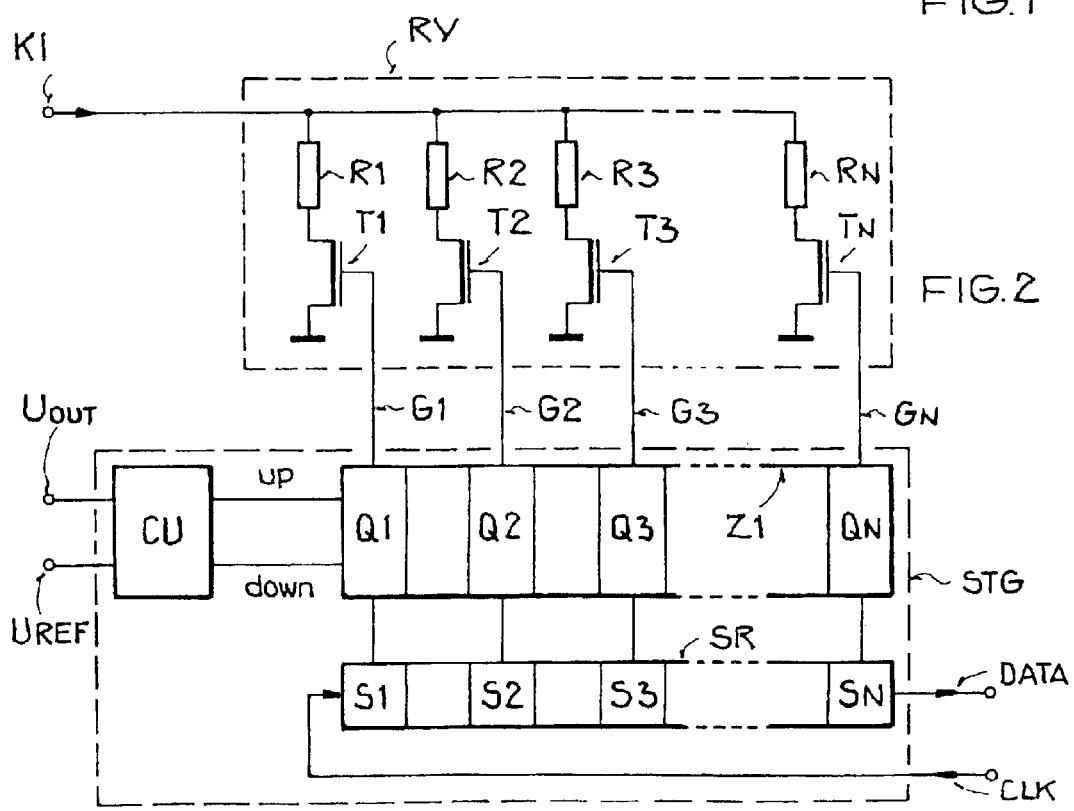
FIG. 2 is a block circuit diagram of a voltage divider, the resistance value of which is discretely changed by means of the control element.

FIG. 2 shows an embodiment for the variable resistance or resistor RV and the control element STG. The explanations provided in conjunction with FIG. 1 apply to the external wiring of the resistor RV and the control element STG. The structure of the circuit arrangement is explained in more detail in the following.

The variable resistor RV has a plurality of circuit arms or parallel branches consisting of similar components. All circuit arms of the resistor RV have a common connection to the node K1, but are connected individually to the control element STG by respective control lines G1, G2, G3 to GN, and are switched on or off by means of a switching element, for example a transistor that is integrated into the individual circuit arm.

A first circuit arm, which is representative of the other circuit arms, is described in the following. The first circuit arm has a series connection of a resistor R1 that is connected to the node K1, and a transistor T1 which is connected to the reference potential and the control line G1. Namely, the control input of the transistor T1 is connected to an output G1 of the control element STG. The further circuit arms respectively have a similar arrangement of a respective resistor R2, R3, RN and a respective transistor T2, T3, TN connected to a respective control line G2, G3, GN. The number of circuit arms and the values of the individual resistors R1 to RN are determined by the size of the range within which the potential is changed at the node K1. Furthermore, the number of circuit arms of the resistor RV determines the number of outputs G1 to GN of the control element STG.

The control element STG comprises a control unit CU with a first input, which is connected to the amplifier output voltage UOUT, and a second input, which is connected to the reference voltage UREF. Furthermore, the control unit comprises a first output UP and a second output DOWN which are connected to a circuit unit Z1. The circuit unit Z1 has individual switching blocks Q1 to QN which are individually respectively connected to the control outputs G1 to GN. Furthermore, each of these switching blocks Q1 to QN is connected individually respectively to a block S1 to SN of a shift register SR. The shift register SR in turn is connected to the clock pulse line CLK and to the data line DATA of the processor unit PC.

The principle of operation is explained in the following. The control unit CU changes the value of the controllable resistor RV by switching the switching blocks Q1 to QN by means of the outputs UP and DOWN as long as the output voltage UOUT lies outside the range or interval determined by the reference voltage UREF. For example, if the circuit block Q1 is switched by the signal UP, the transistor T1 becomes conductive by means of the output G1. In this way, the resistor R1 is connected to the reference potential and the value of the resistor RV is decreased. If the circuit block Q1 is switched with the signal DOWN, the transistor T1 is disabled and the value of the resistor RV is increased. Each change in the status of the circuit block Q1 is stored or held in the block S1 as digital information. The other circuit arms of the resistor RV are switched by means of the outputs G2-GN in a similar manner.

The resistor RV has its lowest resistance value when all of the circuit arms of the resistor RV, i.e. all of the resistors R1, R2, R3, RN are connected to the reference potential. Any selected controlled combination of some of the resistors R1, R2, R3, RN being connected to the reference potential, and some other ones of the resistors R1, R2, R3, RN being in an open circuit arm, provides differing intermediate total resistance values of the variable resistor RV. Thus, the overall resistance value can be changed in discrete steps, whereby the number of available steps is determined by the number of resistors R1, R2, R3, RN (and their combinations).

The input signal UIN can be digitally coded by suitably selecting the values of the resistors R1 to RN. The information about the status of the respective circuit arm stored in the individual blocks S1 to SN of the shift register SR, and therewith the status of the resistors R1, R2, R3, RN, and from that the overall resistance value or state of the resistor RV and/or the level of the input signal UIN can be read-out by the processor PC via the DATA line.

Figure 3:
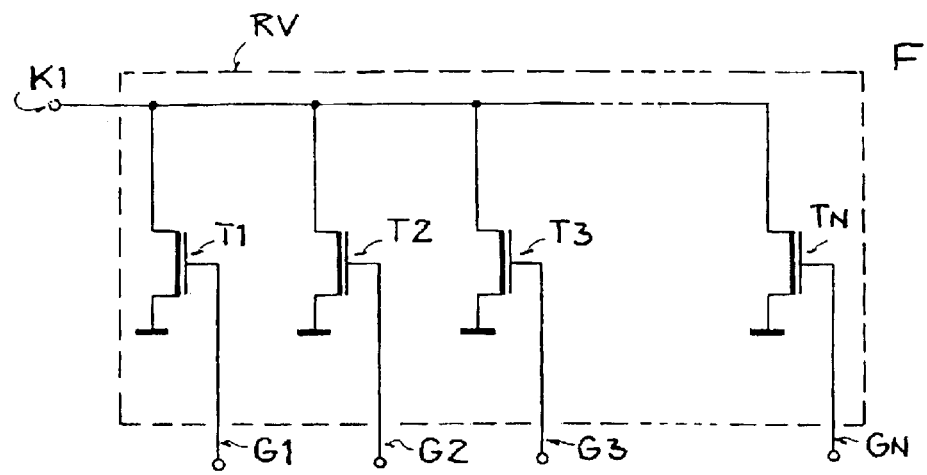
FIG. 3 is a block circuit diagram of an embodiment of the voltage divider with controlled transistors.

FIG. 3 shows another embodiment of the controlled variable resistor RV. In contrast to the embodiment shown in FIG. 2, the separate resistors R1 to RN of the circuit arms are in this case omitted, and the resistances of the individual circuit arms are determined by the inherent resistances of the transistors T1 to TN themselves. In other words the saturation resistance or the level of the switching voltages of transistors T1 to TN determines the magnitude of the resistance of the respective circuit arms. With a defined ratio of the magnitudes of the transistors T1 to TN, the input signal and/or the field strength can be coded in a simple manner.

Figure 4:
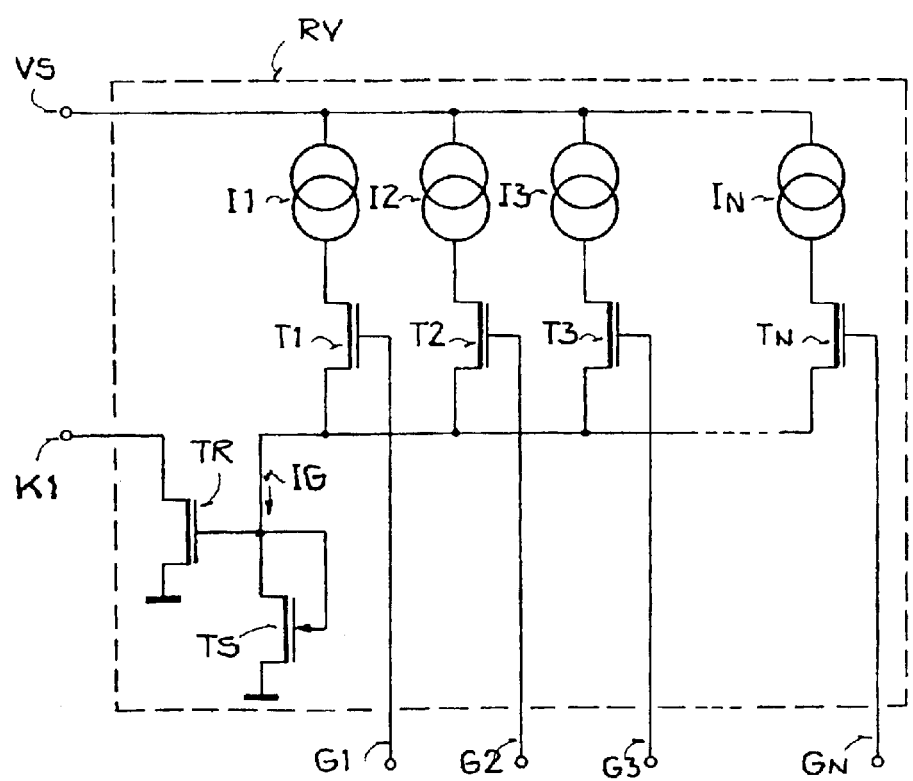
FIG. 4 is a block circuit diagram of another embodiment of the voltage divider with weighted current sources.

In the embodiment of the controlled resistor RV shown in FIG. 4, the individual circuit arms respectively have current sources I1 to IN which are commonly connected to a supply voltage VS. In the following explanations, reference is also made to the embodiments in conjunction with FIG. 2. The individual current sources I1 to IN are all connected to the common line IG through respective transistors T1 to TN, which can be switched to control the individual connection or "switching on" of the current sources I1, I2, I3, IN. In this way, the line IG always carries the summation current of the current sources I1 to IN of the circuit arms whose transistors are switched on. Furthermore, the line IG is connected to a transistor TS, which is wired as a diode, and to the control input of a transistor TR. Also, the transistor TS is connected to the reference potential, while the transistor TR is connected to the node K1 and to the reference potential.

In this arrangement, the transistors TR and TS form a current mirror circuit. Thus, the greater the summation current in the line IG, the greater will be the voltage drop across the transistor TS, and consequently the greater will be the switching voltage at the control input of the transistor TR. The resistance of the transistor TR and the effective overall resistance value of the variable resistor RV are thus correspondingly controlled or particularly, reduced. Thereby, the overall resistance value may be adjusted in discrete steps, similarly as discussed above.

The MOS transistors shown in the embodiments previously described can be replaced by bipolar transistors. The disadvantage of such a bipolar alternative embodiment is that it has a greater current consumption.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of determining a field strength of an electromagnetic signal received by a receiving unit including an operational amplifier having a fixed gain factor, and an input resistance connected to a first input of said operational amplifier, said method comprising the following steps:
   a) providing an input signal that corresponds to or is proportional to an amplitude of said electromagnetic signal received by said receiving unit;
   b) applying said input signal to said input resistance to generate an input voltage, and applying said input voltage to said first input of said operational amplifier;
   c) amplifying said input voltage by said fixed gain factor in said operational amplifier to produce an output voltage at an output of said operational amplifier;
   d) comparing said output voltage with a reference voltage;
   e) changing a resistance value of said input resistance so as to change a voltage value of said input voltage until said output voltage lies within a prescribed voltage range around and including said reference voltage, at which said resistance value is a final adjusted resistance value; and
   f) determining a field strength value for said electromagnetic signal dependent on said final adjusted resistance value by comparing said final adjusted resistance value with a stored set of nominal resistance values and nominal field strength values respectively allocated thereto.

2. The method according to claim 1, further comprising a preliminary step of empirically determining and then storing in a memory unit said stored set of nominal resistance values and nominal field strength values respectively allocated thereto.

3. The method according to claim 1, further comprising a preliminary step of providing said reference voltage to have a fixed constant voltage level.

4. The method according to claim 1, wherein said changing of said resistance value in said step e) comprises increasing said resistance value if said output voltage lies below said prescribed voltage range, and decreasing said resistance value if said output voltage lies above said prescribed voltage range, so as to drive said output voltage into and to remain in said prescribed voltage range.

5. The method according to claim 1, further comprising determining a ratio of said input voltage to said output voltage.

6. The method according to claim 1, wherein said changing of said resistance value in said step e) is carried out in discrete resistance value stages.

7. The method according to claim 1, wherein said input resistance comprises a voltage divider with a divider node, and wherein said step b) comprises generating said input voltage at said divider node and applying said input voltage from said divider node to said first input of said operational amplifier.

8. The method according to claim 7, wherein said voltage divider includes a first resistor and a second resistor connected to each other with said divider node therebetween, said second resistor is a variable resistor that is further connected to a reference potential, and said changing of said resistance value in said step e) comprises changing a variable resistance value of said variable resistor.

9. The method according to claim 1, wherein said changing of said resistance value in said step e) comprises selectively closing one or more selected parallel circuit branches among a plurality of available parallel circuit branches so that a total parallel summed resistance of said one or more selected parallel circuit branches establishes said resistance value.

10. The method according to claim 9, wherein said resistance value of said input resistance is represented by a digital state representing which one or more selected parallel circuit branches among said plurality of available parallel circuit branches are closed, and said nominal resistance values are respective different digital states representing different ones or different combinations of said plurality of available parallel circuit branches being closed.

11. The method according to claim 1, wherein said determining of said field strength value for said electromagnetic signal in said step f) comprises selecting as said field strength value a respective particular one of said nominal field strength values allocated to a respective particular one of said nominal resistance values that is equal to or closest to said final adjusted resistance value among said nominal resistance values.

12. The method according to claim 1, further comprising a preliminary step of transmitting said electromagnetic signal from a transmitting unit, and further comprising an additional step following said step f) of determining a distance between said transmitting unit and said receiving unit dependent on said field strength value determined in said step f).

13. The method according to claim 12, wherein said determining of said distance in said additional step comprises looking up a stored distance value allocated to a respective one of said nominal field strength values that has been determined as said field strength value for said electromagnetic signal.

14. The method according to claim 12, further comprising terminating or blocking said transmitting of said electromagnetic signal by said transmitting unit, or blocking a further evaluation of said electromagnetic signal received in said receiving unit, if said distance determined in said additional step exceeds a maximum permissible distance value.

15. The method according to claim 12, further comprising varying a data transmission rate of said transmitting dependent on said distance determined in said additional step.

16. A circuit arrangement for determining a field strength of an electromagnetic signal received by a receiving unit, said circuit arrangement comprising:
   an operational amplifier having a first amplifier input, a second amplifier input, and an amplifier output;
   a voltage divider including a first resistor and a controllable variable second resistor connected to one another in series with a divider node therebetween, wherein said divider node is connected to said first amplifier input, said first resistor has a first terminal opposite said divider node connected to a signal input to which is applied said electromagnetic signal or an input signal proportional thereto, said second resistor has a second terminal opposite said divider node connected to a reference potential, and said second resistor has at least one control input by which a variable resistance of said second resistor can be controlled;
   a control element having a reference input to which a reference voltage is applied, a signal input connected to said amplifier output, at least one control output connected to said control input of said controllable variable second resistor, a data output and a clock input;
   a processor unit having a data input connected to said data output of said control element, a clock output connected to said clock input of said control element, and a data in/out port; and
   a memory unit connected to said data in/out port of said processor unit.

17. The circuit arrangement according to claim 16, further comprising a feedback voltage divider including two resistors connected in series and having a divider node therebetween connected to said second amplifier input, a first end terminal of said feedback voltage divider connected to said amplifier output, and a second end terminal of said feedback voltage divider connected to said reference potential, wherein said feedback voltage divider fixes a gain factor of said operational amplifier.

18. The circuit arrangement according to claim 16, wherein said second resistor has a plurality of said control inputs, said control element has a plurality of said control outputs, said second resistor comprises plural circuit branches that are connected parallel to each other and that each respectively comprise a respective controllable switching element, each said switching element has a respective one of said control inputs which is connected to a respective one of said control outputs of said control element, and each said switching element is arranged and adapted to controlledly open and close a respective one of said circuit branches in which it is arranged.

19. The circuit arrangement according to claim 18, wherein each one of said plural circuit branches further comprises a respective resistor connected in series with said respective switching element.

20. The circuit arrangement according to claim 18, wherein each one of said controllable switching elements is a respective transistor.

21. The circuit arrangement according to claim 20, wherein each said respective transistor is a MOS transistor.

22. The circuit arrangement according to claim 20, wherein each one of said plural circuit branches contains no further circuit element in addition to said respective transistor, and a resistance of each one of said plural circuit branches is defined by an inherent resistance of said respective transistor.

23. The circuit arrangement according to claim 18, wherein each one of said circuit branches further comprises a respective current source connected in series with said respective switching element.

24. The circuit arrangement according to claim 23, wherein each said respective current source is a controllable current source.

25. The circuit arrangement according to claim 23, wherein said second resistor further comprises a current mirror arrangement that includes two transistors, and is connected in common to all of said plural circuit branches, and is connected to said divider node of said voltage divider, and is connected to said reference potential.

* * * * *